US009817080B2

(12) United States Patent
Chou et al.

(10) Patent No.: US 9,817,080 B2
(45) Date of Patent: Nov. 14, 2017

(54) MAGNETIC FIELD PROBE AND PROBE HEAD THEREOF

(71) Applicant: NATIONAL TAIWAN UNIVERSITY, Taipei (TW)

(72) Inventors: Yien-Tien Chou, Taipei (TW); Hsin-Chia Lu, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 15/613,261

(22) Filed: Jun. 4, 2017

(65) Prior Publication Data

US 2017/0269170 A1 Sep. 21, 2017

Related U.S. Application Data

(62) Division of application No. 14/198,599, filed on Mar. 6, 2014, now Pat. No. 9,684,040.

(30) Foreign Application Priority Data

Mar. 6, 2013 (TW) .............................. 102107876 U

(51) Int. Cl.
*G01R 33/00* (2006.01)
(52) U.S. Cl.
CPC ................................ *G01R 33/0076* (2013.01)
(58) Field of Classification Search
None
See application file for complete search history.

(56) References Cited

U.S. PATENT DOCUMENTS

| 6,163,150 | A  | 12/2000 | Tamaki et al. |
| 6,184,693 | B1 | 2/2001  | Arai et al. |
| 6,320,376 | B1 | 11/2001 | Tamaki et al. |
| 6,856,131 | B2 | 2/2005  | Miyazawa et al. |
| 7,326,098 | B2 | 2/2008  | Choi et al. |

(Continued)

FOREIGN PATENT DOCUMENTS

| EP | 0239251 A2  | 9/1987 |
| TW | M0417733 U1 | 4/2011 |
| TW | 201232007 A | 8/2012 |

OTHER PUBLICATIONS

Chou et al., "Magnetic Near-Field Probes with High-Pass and Notch Filters for Electric Field Suppression" IEEE Transactions on Microwave Theory and Techniques, vol. 61, No. 6, pp. 2460-2470, Jun. 2013.

*Primary Examiner* — Jermele M Hollington
(74) *Attorney, Agent, or Firm* — CKC & Partners Co., Ltd.

(57) ABSTRACT

A magnetic field probe and a probe head thereof are disclosed herein. The probe head includes an inner metal layer, a shielding unit, and a filtering unit. The inner metal layer receives a magnetic field to be measured. The shielding unit, including a first shielding metal layer and a second shielding metal layer, shields the inner metal layer. The first and the second shielding metal layer are respectively stacked above and below the inner metal layer. The filtering unit, including a first filtering metal layer and a second filtering metal layer, filters out an electric field interfering with the inner metal layer. The first filtering metal layer is stacked between the first shielding metal layer and the inner metal layer. The second filtering metal layer is stacked between the second shielding metal layer and the inner metal layer.

9 Claims, 8 Drawing Sheets

(56) References Cited

U.S. PATENT DOCUMENTS

| | | |
|---|---|---|
| 7,595,650 B2 | 9/2009 | Funato et al. |
| 8,330,555 B2 | 12/2012 | Yoshikawa et al. |
| 8,575,926 B2 | 11/2013 | Chao et al. |
| 9,606,198 B2 * | 3/2017 | Chou .................... G01R 33/10 |
| 9,684,040 B2 * | 6/2017 | Chou ................. G01R 33/0076 |
| 2006/0180881 A1 | 8/2006 | Nam et al. |
| 2008/0316656 A1 | 12/2008 | Miyata et al. |
| 2015/0160309 A1 | 6/2015 | Chou et al. |
| 2016/0011278 A1 | 1/2016 | Kim et al. |

* cited by examiner

MAGNETIC FIELD PROBE AND PROBE HEAD THEREOF

RELATED APPLICATIONS

The present application is a Divisional application of the U.S. application Ser. No. 14/198,599, filed Mar. 6, 2014, which claims priority to Taiwan Application Serial Number 102107876, filed Mar. 6, 2013, all of which are herein incorporated by reference.

BACKGROUND

Field of Invention

The present invention relates to a magnetic field probe. More particularly, the present invention relates to a probe head of a magnetic field probe.

Description of Related Art

With electronic products trending smaller and smaller and the rapid development of radio transmission and high-speed circuits, the integration of circuits therein has become more and more complex. Such circuits incur various problems, such as problems of signal integrity (SI) and electromagnetic interference (EMI), which increase the difficulty in circuit design and debugging. During a debugging process, a magnetic field probe can be utilized to scan so as to detect a magnetic field distribution nearby an electronic product, thus identifying an electromagnetic interference source rapidly.

FIG. 1 depicts a magnetic field probe according to the prior art. As shown in FIG. 1, a magnetic field probe 10 has a triple-layered metal structure. A metal interlayer 11 is a loop for receiving a magnetic field to be measured.

Due to the small sizes of the devices to be tested and the various sources of interference, market demand for magnetic field probes having a high spatial resolution and a wide operating bandwidth has been increasing. However, the smaller the distance between a magnetic field probe and a device to be tested is, the more obvious the electric field noises will interfere the result of magnetic field detection. Although increasing the loop size can reduce the interference caused by electric field noises, at the same time the spatial resolution is reduced and resonance frequency tends to occur at low detection frequencies. As a result, the probe cannot detect the correct magnetic field distribution at the resonance frequency.

Therefore, it is necessary to solve the above-mentioned problems by providing a novel design.

SUMMARY

The present invention related to a magnetic field probe and a probe head thereof. Due to the effect of an electric field filter that the probe head has, the electric field is suppressed to allow the magnetic field probe to have a more compact design and to improve the spatial resolution of magnetic field detection.

A probe head is provided. The probe head comprises an inner metal layer, a shielding unit, and a filtering unit. The inner metal layer is configured for receiving a magnetic field to be measured. The shielding unit is configured for shielding the inner metal layer. The shielding unit comprises a first shielding metal and a second shielding metal layer. The first shielding metal layer is stacked above the inner metal layer, and the second shielding metal layer is stacked below the inner metal layer. The filtering unit is configured for filtering out an electric field interfering with the inner metal layer. The filtering unit comprises a first filtering metal layer and a second filtering metal layer. The first filtering metal layer is stacked between the first shielding metal layer and the inner metal layer, and the second filtering metal layer is stacked between the second shielding metal layer and the inner metal layer.

In the foregoing, each of the first shielding metal layer and the second shielding metal layer comprises an annular shielding metal portion. Each of the annular shielding metal portions has a gap.

In the foregoing, the first filtering metal layer comprises a first annular filtering metal portion. The second filtering metal layer comprises a second annular filtering metal portion. Each of the first annular filtering metal portion and the second annular filtering metal portion has a gap.

In the foregoing, the probe head further comprises at least one connecting metal portion. Each of the first annular filtering metal portion and the second annular filtering metal portion is connected to the first shielding metal layer and the second shielding metal layer via the at least one connecting metal portion.

In the foregoing, the probe head further comprises a first connecting metal portion and a second connecting metal portion. The first annular filtering metal portion is connected to the first shielding metal layer via the first connecting metal portion. The second annular filtering metal portion is connected to the second shielding metal layer via the second connecting metal portion.

In the foregoing, the probe head further comprises at least one extending connection metal portion. The at least one extending connection metal portion has a first end and a second end. The first end is floating. The second end is connected to one of the first annular filtering metal portion and the second annular filtering metal portion.

In the foregoing, the probe head further comprises a first extending metal portion and a second extending metal portion. The first extending metal portion is stacked between the first annular filtering metal portion and the first shielding metal layer. The first extending metal portion is connected to the first annular filtering metal portion. The second extending metal portion is stacked between the second annular filtering metal portion and the second shielding metal layer. The second extending metal portion is connected to the second annular filtering metal portion.

In the foregoing, the probe head further comprises a first shorting portion and a second shorting portion. The first shorting portion is connected between the first extending metal portion and the first shielding metal layer. The second shorting portion is connected between the second extending metal portion and the second shielding metal layer.

In the foregoing, the probe head further comprises a plurality of first extending metal portions and a plurality of second extending metal portions. The plurality of first extending metal portions are sequentially connected between the first annular filtering metal portion and the first shielding metal layer. One of the plurality of first extending metal portions is connected to the first annular filtering metal portion. The plurality of second extending metal portions are sequentially connected between the second annular filtering metal portion and the second shielding metal layer. One of the plurality of second extending metal portions is connected to the second annular filtering metal portion.

In the foregoing, the probe head further comprises a first shorting portion and a second shorting portion. The first shorting portion is connected between one of the first extending metal portions and the first shielding metal layer.

The second shorting portion is connected between one of the second extending metal portions and the second shielding metal layer.

The invention provides a magnetic field probe. The magnetic field probe comprises a probe head and a probe body. The probe head comprises a first annular shielding metal portion, a second annular shielding metal portion, a receiving metal portion, a first annular filtering metal portion, and a second annular filtering metal portion. The first annular shielding metal portion has a gap. The second annular shielding metal portion is stacked below the first annular shielding metal portion. The second annular shielding metal portion has another gap. A shape of the second annular shielding metal portion corresponds to a shape of the first annular shielding metal portion. The receiving metal portion is stacked between the first annular shielding metal portion and the second annular shielding metal portion. The receiving metal portion is configured for receiving a magnetic field to be measured to generate a sensing signal. The first annular shielding metal portion and the second annular shielding metal portion are configured for shielding the receiving metal portion. The first annular filtering metal portion is stacked between the first annular shielding metal portion and the receiving metal portion. The first annular filtering portion is configured for filtering out an electric field interfering with the receiving metal portion, and the first annular filtering metal portion has a first gap, a first end, and a second end across the first gap. The second annular filtering metal portion is stacked between the second annular shielding metal portion and the receiving metal portion. The second annular filtering portion is configured for filtering out the electric field interfering with the receiving metal portion, and the second annular filtering metal portion has a second gap, a third end, and a fourth end across the second gap. The probe body is connected to the probe head. The probe body is configured for receiving the sensing signal from the receiving metal portion and transmitting the sensing signal to a measuring instrument.

In the foregoing, the probe head further comprises at least one connecting metal portion. The first end of the first annular filtering metal portion and the third end of the second annular filtering metal portion are connected to the first annular shielding metal layer and the second annular shielding metal layer via the at least one connecting metal portion.

In the foregoing, the probe head further comprises a first shorting portion and a second shorting portion. The second end of the first annular filtering metal portion is connected to the first annular shielding metal portion via the first shorting portion. The fourth end of the second annular filtering metal portion is connected to the second annular shielding metal portion via the second shorting portion.

In the foregoing, the probe head further comprised a first extending metal portion, a first extending connection metal portion, a second extending metal portion, and a second extending connection metal portion. The first extending metal portion is stacked between the first annular filtering metal portion and the first annular shielding metal portion. The first extending metal portion is connected to the second end of the first annular filtering metal portion via the first extending connection metal portion. The second extending metal portion is stacked between the second annular filtering metal portion and the second annular shielding metal portion. The second extending metal portion is connected to the fourth end of the second annular filtering metal portion via the second extending connection metal portion.

In the foregoing, the probe head further comprises a first shorting portion and a second shorting portion. The first extending metal portion is connected to the first annular shielding metal portion via the first shorting portion. The second extending metal portion is connected to the second annular shielding metal portion via the second shorting portion.

In the foregoing, the probe head further comprises a plurality of first extending metal portions, a plurality of first extending connection metal portions, a plurality of second extending metal portions, and a plurality of second extending connection metal portions. The plurality of first extending metal portions are sequentially stacked between the first annular filtering metal portion and the first annular shielding metal portion. Each of the first extending metal portions is respectively connected to the upper-layer first extending metal portion and the lower-layer first extending metal portion via one of the first extending connection metal portions and one of the other first extending connection metal portions, and the first extending metal portions which is closest to the first annular filtering metal portion among all said first extending metal portions is connected to the first annular filtering metal portion via one of the first extending connection metal portions. The plurality of second extending metal portions are sequentially stacked between the second annular filtering metal portion and the second annular shielding metal portion. Each of the second extending metal portions is respectively connected to the upper-layer second extending metal portion and the lower-layer second extending metal portion via one of the second extending connection metal portions and one of the other second extending connection metal portions, and one of the second extending metal portions which is closest to the second annular filtering metal portion among all said second extending metal portions is connected to the second annular filtering metal portion via one of the second extending connection metal portion.

In the foregoing, the probe head further comprises a first shorting portion and a second shorting portion. The first shorting portion is connected between the first extending metal portion closest to the first annular shielding metal portion. The second shorting portion is connected between the second extending metal portion closest to the second annular shielding metal portion and the second annular shielding metal portion.

In the foregoing, the probe body comprises a first shielding metal portion, a second shielding metal portion, and a transmitting metal portion. The first shielding metal portion is connected to the first annular shielding metal portion. The second shielding metal portion is stacked below the first shielding metal portion and connected to the second annular shielding metal portion. The transmitting metal portion is configured for transmitting the sensing signal to the measuring instrument, and the transmitting metal portion is stacked between the first shielding metal portion and the second shielding metal portion.

In the foregoing, the probe body comprises a plurality of shielding metal connection portions. The plurality of shielding metal connection portions are connected between the first shielding metal portion and the second shielding metal portion.

According to the present invention, by applying the above-mentioned magnetic field probe and probe head in magnetic field detection, the electric field is suppressed and the measurement of magnetic field is more accurate. The compact design of the magnetic field probe allows the magnetic field probe to be applied in the magnetic field detection requiring a higher spatial resolution. The magnetic field probe can be mass-produced because of the simple multi-layered structure and hence the manufacturing cost is reduced.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
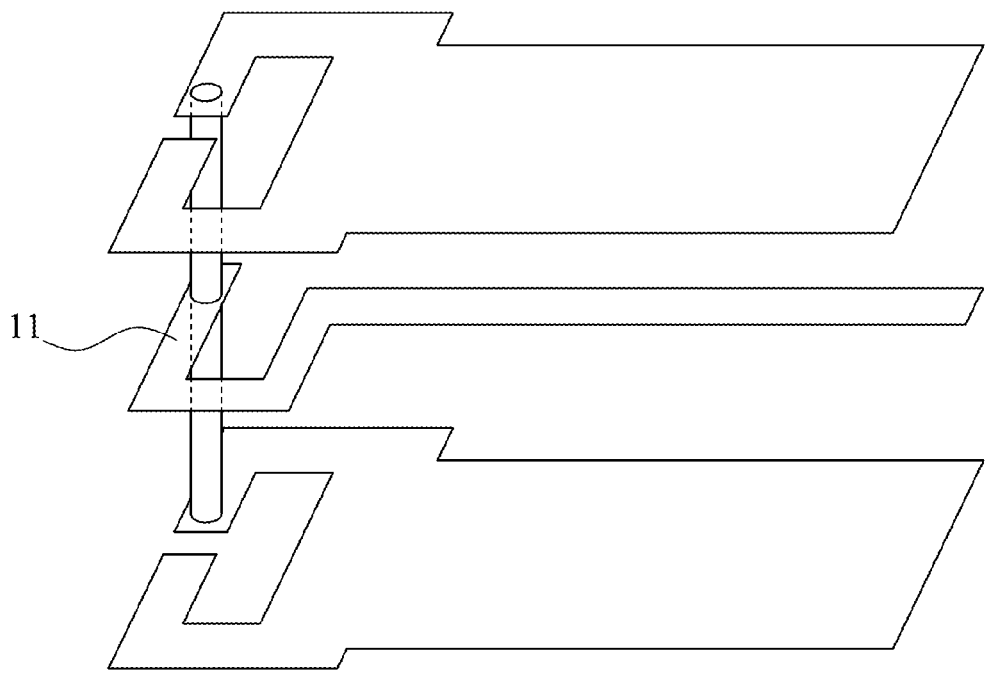
FIG. 1 is a perspective view of a magnetic field probe according to the prior art.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those of ordinary skill in the art. Wherever possible, the same reference numbers are used in the drawings and the description to refer to the same or like parts.

The terminology used herein is for the purpose of describing particular example embodiments only and is not intended to be limiting of the present invention. As used herein, the singular forms "a", "an", and "the" are intended to include the plural forms as well. It will be further understood that the terms "comprises", "comprising", or "has", "have", "having" when used in this specification, specify the presence of stated features, parts, integers, steps, operations, elements, and/or components, but do not preclude the presence or addition of one or more other features, parts, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

In addition, relative terms, such as "beneath", "below", or "bottom", and "above" or "top", may be used herein for ease of description to describe one element's relationship to another element(s) as illustrated in the figures. It will be understood that the relative terms are intended to encompass different orientations of the device. For example, if the device in one of the figures is turned over, elements described as "below" other elements would then be oriented "above" the other elements. Thus, the exemplary term "below" can encompass both an orientation of above and below. Similarly, if the device in one of the figures is turned over, elements described as "lower than" or "under" other elements would then be oriented "upper than" the other elements. Thus, the exemplary term "lower" or "under" can encompass orientations of upper and lower.

As used herein, "the first", "the second", . . . etc. do not refer to the order or priority, nor are they intended to limit the invention. They are merely used to distinguish the devices or operations described with the same technical terms.

In addition, as used herein, both "couple" and "connect" refer to direct physical contact or electrical contact or indirect physical contact or electrical contact between two or more components. Or they can also refer to reciprocal operations or actions between two or more components.

As used herein, "around", "about", or "approximately" shall generally mean within 20 percent, preferably within 10 percent, and more preferably within 5 percent of a given value or range. Numerical quantities given herein are approximate, meaning that the term "around," "about" or "approximately" can be inferred if not expressly stated.

Figure 2:
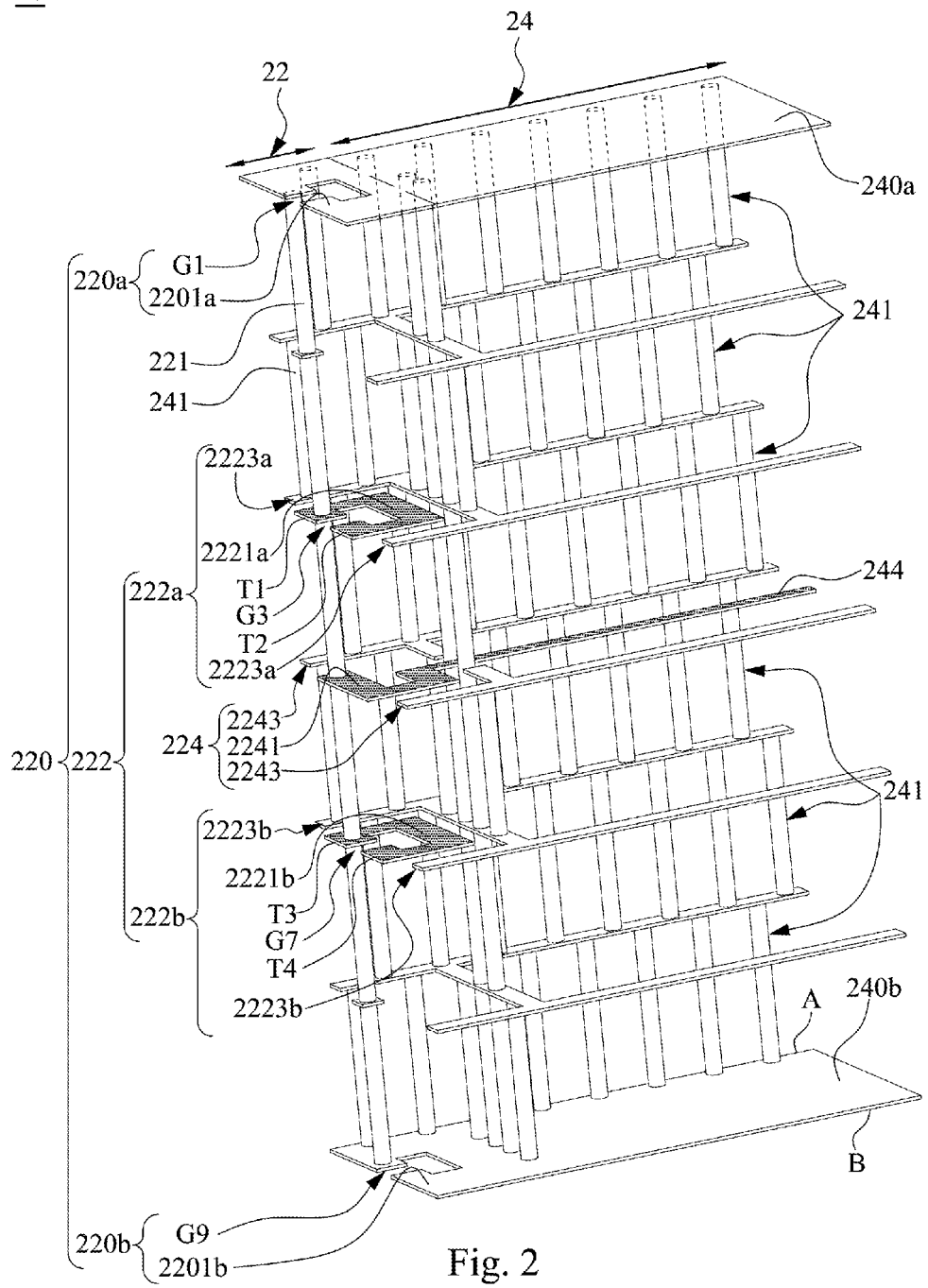
FIG. 2 depicts a perspective view of a magnetic field probe according to a first embodiment of this invention.

FIG. 2 depicts a perspective view of a magnetic field probe according to a first embodiment of this invention. As shown in FIG. 2, a magnetic field probe 20 comprises a probe head 22 and a probe body 24. The probe head 22 comprises an inner metal layer 224, a shielding unit 220, and a filtering unit 222. The inner metal layer 224 is configured for receiving a magnetic field to be measured. The shielding unit 220 is configured for shielding the inner metal layer 224. The filtering unit 222 is configured for filtering out an electric field interfering with the inner metal layer 224. The probe body 24 is configured for transmitting a sensing signal corresponding to the magnetic field to be measured to a measuring instrument.

According to the present embodiment, the shielding unit 220 comprises a shielding metal layer 220a and a shielding metal layer 220b respectively stacked above and below the inner metal layer 224. The filtering unit 222 comprises a filtering metal layer 222a and a filtering metal layer 222b. The filtering metal layer 222a is stacked between the shielding metal layer 220a and the inner metal layer 224. The filtering metal layer 222b is stacked between the shielding metal layer 220b and the inner metal layer 224. The above-mentioned metal layers are stacked together with insulating layers therebetween to form the probe head 22.

The shielding metal layer 220a and the shielding metal layer 220b comprise an annular shielding metal portion 2201a and an annular shielding metal portion 2201b, respectively. The annular shielding metal portion 2201a and the annular shielding metal portion 2201b respectively have a gap G1 and a gap G9, so that the annular shielding metal portion 2201a and the annular shielding metal portion 2201b are in a shape of C. As shown in FIG. 2, the shape of the annular shielding metal portion 2201a corresponds to the shape of the annular shielding metal portion 2201b. It is noted that the shape of the annular shielding metal portion 2201a and the annular shielding metal portion 2201b is not limited to a rectangular annulus (to cut a small rectangle out of middle of a large rectangle, see FIG. 2), the shape may be a circular annulus (to cut a small circle out of middle of a large circle), a triangular annulus (to cut a small triangle out of middle of a large triangle), or any annuluses having other geometric shapes. Those of ordinary skill in the art may select the appropriate geometrical shapes to form the annuluses of the annular shielding metal portion 2201a and the annular shielding metal portion 2201b.

The inner metal layer 224 comprises a receiving metal portion 2241 and isolating metal portions 2243. The probe head 22 receives the magnetic field to be measured through the receiving metal portion 2241 to generate the sensing signal that is transmitted to the probe body 24. The annular shielding metal portion 2201a and the annular shielding metal portion 2201b shield the receiving metal portion 2241 therebetween. Each of the isolating metal portions 2243 acts as a partial shield on one side of the probe head 22 so as to protect the receiving metal portion 2241 from receiving an interfering electric field from the one side. The receiving metal portion 2241 is short circuited to the shielding unit 220 via at least one connecting metal portion 221. In addition, the isolating metal portions 2243 in the inner metal layer 224 are connected to the shielding unit 220 via a plurality of shielding metal connection portions 241 so as to form side shields of the probe head 22. It is noted that in FIG. 2 only the shielding metal connection portions 241 on side A are depicted. However, those of ordinary skill in the art may dispose the shielding metal connection portions 241 on side B to connect the isolating metal portion 2243 and the shielding unit 220 so as to form shielding on both of the side A and the side B. Additionally, those of ordinary skill in the art may selectively dispose the shielding metal connection portions 241 as required by practical needs. For example, the present invention may be realized by a thin film transistor process because none of the shielding metal connection portions 241 needs to be disposed when a slim magnetic field probe is utilized to incur less severe side interferences, and the present invention is not limited to the specific embodiment.

The filtering metal layer 222a and the filtering metal layer 222b are symmetrically disposed with respect to the receiving metal portion 2241 so as to effectively suppress a common mode current induced by the interfering electric field. As a result, the interfering electric field is filtered out to improve the quality of magnetic field measurement. Hence, the present invention magnetic field probe 20 has effects of a wide-band high-pass and band-rejection electric field filter to suppress the electric field. In this manner, a smaller magnetic field probe can be designed without sacrificing the property of electric field suppression that can be applied in the magnetic field detection requiring a higher spatial resolution and a wider band. In addition, the present invention multi-layered magnetic field probe 20 can be fabricated by various processes (such as the low temperature co-fired ceramic process, LTCC process) conveniently, thus having a low cost and being easily mass-produced.

In one embodiment, as shown in FIG. 2, the filtering metal layer 222a comprises an annular filtering metal portion 2221a and an isolating metal portion 2223a, the filtering metal layer 222b comprises an annular filtering metal portion 2221b and an isolating metal portion 2223b. The annular filtering metal portion 2221a and the annular filtering metal portion 2221b are configured for filtering out the electric field interfering with the receiving metal portion 2241. The isolating metal portion 2223a and the isolating metal portion 2223b act as a partial shield on the sides of the probe head 22 so as to protect the receiving metal portion 2241 from receiving the interfering electric field from the sides.

The annular filtering metal portion 2221a is stacked between the annular shielding metal portion 2201a and the receiving metal portion 2241. The annular filtering metal portion 2221b is stacked between the annular shielding metal portion 2201b and the receiving metal portion 2241. The annular filtering metal portion 2221a has a gap G3, an end T1, and an end T2 across the gap G3. The annular filtering metal portion 2221b has a gap G7, an end T3, and an end T4 across the gap G7. With such a structure, the annular filtering metal portion 2221a and the annular filtering metal portion 2221b are in a shape of C. It is noted that the shape of the annular filtering metal portion 2221a and the annular filtering metal portion 2221b is not limited to a rectangular annulus (to cut a small rectangle out of middle of a large rectangle, see FIG. 2), the shape may be a circular annulus (to cut a small circle out of middle of a large circle), a triangular annulus (to cut a small triangle out of middle of a large triangle), or any annuluses having other geometric shapes. Those of ordinary skill in the art may select the appropriate geometrical shapes to form the annuluses of the annular filtering metal portion 2221a and the annular filtering metal portion 2221b.

In addition, the isolating metal portion 2223a and the isolating metal portion 2223b are connected to the shielding unit 220 via the plurality of shielding metal connection portions 241 so as to form a side shield of the probe head 22. In FIG. 2, only the shielding metal connection portions 241 on the side A are depicted. However, those of ordinary skill in the art may dispose the plurality of shielding metal connection portions 241 on the side B so as to connect the isolating metal portion 2223a and the isolating metal portion 2223b to the shielding unit 220. With such a structure, shielding is formed on the both sides of the probe head 22. It is noted that those of ordinary skill in the art may selectively dispose the shielding metal connection portions 241 as required by practical needs. For example, the present invention may be realized by a thin film transistor process because none of the shielding metal connection portions 241 needs to be disposed when a slim probe is utilized to incur less severe side interferences, and the present invention is not limited to the specific embodiment.

The annular filtering metal portion 2221a and the annular filtering metal portion 2221b are symmetrically disposed with respect to the receiving metal portion 2241 so as to effectively suppress the common mode current induced by the interfering electric field. As a result, the interfering electric field is filtered out to improve the quality of magnetic field measurement. Hence, the present invention magnetic field probe 20 has effects of a wide-band high-pass and band-rejection electric field filter to suppress the electric field. In this manner, a smaller magnetic field probe can be designed without sacrificing the property of electric field suppression that can be applied in the magnetic field detection requiring a higher spatial resolution and a wider band. In addition, the present invention multi-layered magnetic field probe 20 can be fabricated by various processes (such as the low temperature co-fired ceramic process, LTCC process) conveniently, thus having a low cost and being easily mass-produced.

In one embodiment, the probe head 22 further comprises the at least one connecting metal portion 221 to allow the annular filtering metal portion 2221a and the annular filtering metal portion 2221b to connect to the shielding metal layer 220a and the shielding metal layer 220b via the at least one connecting metal portion 221. In this manner, the annular filtering metal portion 2221a, the annular filtering metal portion 2221b, the shielding metal layer 220a, and the shielding metal layer 220b have the same DC voltage level. In greater detail, in one embodiment, the end T1 of the annular filtering metal portion 2221a and the end T3 of the annular filtering metal portion 2221b are connected to the annular shielding metal portion 2201a and the annular shielding metal portion 2201b via the above-mentioned connection metal portion 221, and connection positions are not limited to the connection positions of the specific embodiment.

In another embodiment, the probe body 24 comprises a shielding metal portion 240a, a shielding metal portion 240b, and a transmitting metal portion 244. The transmitting metal portion 244 is configured for transmitting the sensing signal corresponding to the magnetic field to be measured to the measuring instrument. The shielding metal portion 240a and the shielding metal portion 240b are electrically coupled to ground of the measuring instrument and configured for shielding the transmitting metal portion 244 between the shielding metal portion 240a and the shielding metal portion 240b so as to protect the sensing signal from being interfered with during transmission. The shielding metal portion 240a is connected to the annular shielding metal portion 2201a. The shielding metal portion 240b is stacked below the shielding metal portion 240a and is connected to the annular shielding metal portion 2201b so that the annular shielding metal portion 2201a and the annular shielding metal portion 2201b are electrically coupled to ground of the measuring instrument.

In another embodiment, the probe body 24 further comprises the plurality of shielding metal connection portions 241. As shown in FIG. 2, the shielding metal connection portions 241 are connected between the shielding metal portion 240a and the shielding metal portion 240b so as to form a shield on sides of the probe body 24. In FIG. 2, only the shielding metal connection portions 241 on the side A are depicted. However, those of ordinary skill in the art may dispose the plurality of shielding metal connection portions 241 on the side B so as to connect the shielding metal portion 240a and the shielding metal portion 240b. With such a structure, shielding is formed on the both sides of the probe body 24. It is noted that those of ordinary skill in the art may selectively dispose the shielding metal connection portions 241 as required by practical needs. For example, the present invention may be realized by a thin film transistor process because none of the shielding metal connection portions 241 needs to be disposed when a slim probe is utilized to incur less severe side interferences, and the present invention is not limited to the specific embodiment.

Figure 3:
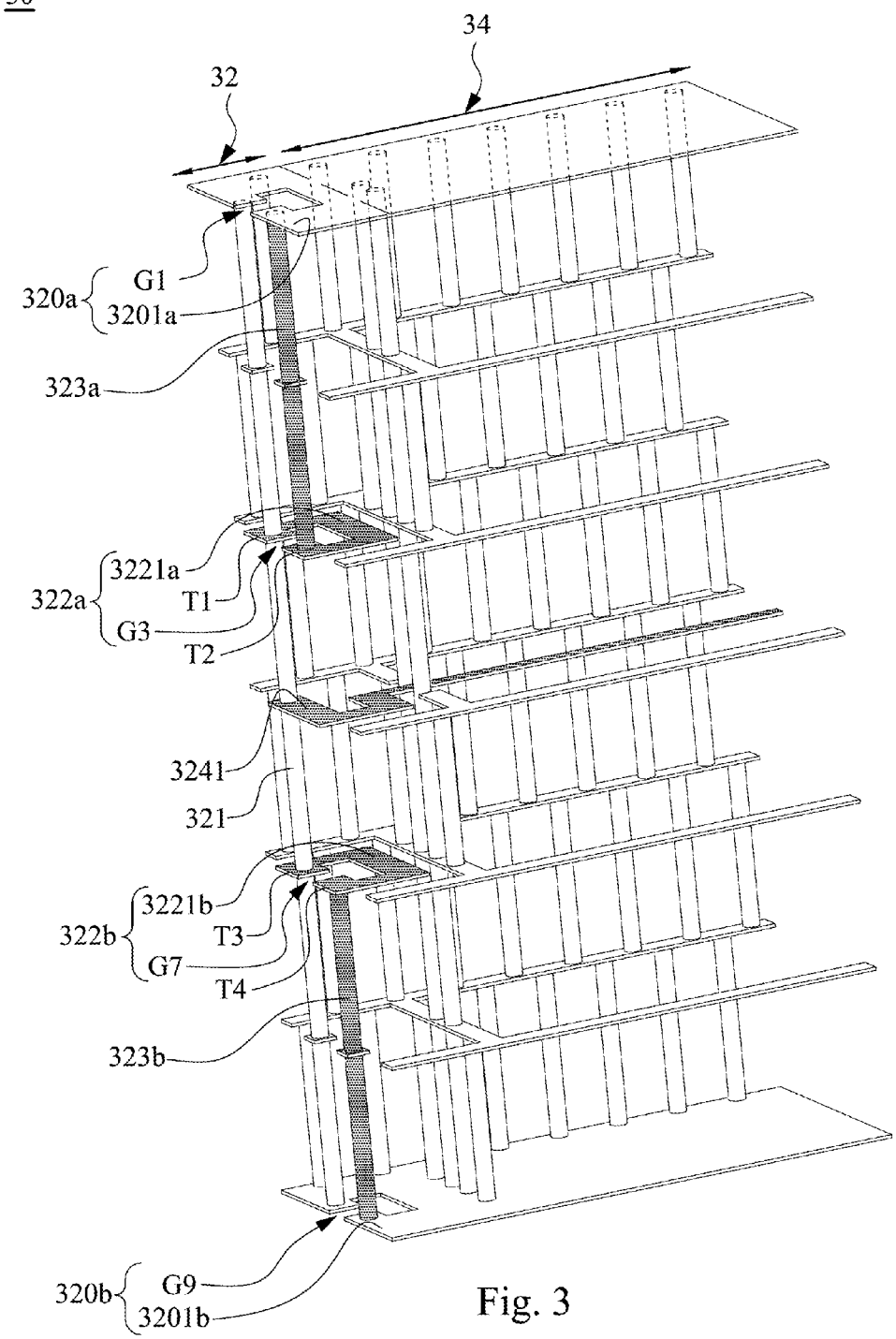
FIG. 3 depicts a perspective view of a magnetic field probe according to a second embodiment of this invention.

FIG. 3 depicts a perspective view of a magnetic field probe according to a second embodiment of this invention. When compared with FIG. 2, a probe head 32 according to the present embodiment further comprises a shorting portion 323a and a shorting portion 323b configured for inducing inductances to the probe head 32 through the shorting portion 323a and the shorting portion 323b. Hence, the frequency band of the magnetic field probe 30 having an effect of an electric field band rejection filter in which the electric field is filtered out may be adjusted as required by practical needs. For example, the frequency band of the magnetic field probe 30 in which the electric field is filtered out may be adjusted to a higher frequency band.

An annular filtering metal portion 3221a is connected to the shielding metal layer 320a via the shorting portion 323a. An annular filtering metal portion 3221b is connected to the shielding metal layer 320b via the shorting portion 323b. In greater detail, in one embodiment, an end T2 of the annular filtering metal portion 3221a is connected to an annular shielding metal portion 3201a via the shorting portion 323a. An end T4 of the annular filtering metal portion 3221b is connected to an annular shielding metal portion 3201b via the shorting portion 323b. It is noted that a connection position of the shorting portion 323a and the annular filtering metal portion 3221a and a connection position of the shorting portion 323b and the annular filtering metal portion 3221b are not limited to the connection positions of the specific embodiment. Those of ordinary skill in the art may adjust the above-mentioned connection positions as required by practical needs.

Through the embodiment shown in FIG. 3, the frequency of the magnetic field probe 30 at which the electric field is filtered out can be adjusted to a frequency within a higher frequency band without shrinking a loop size of a receiving metal portion 3241. Thus, designing of the magnetic field probe is not restricted by process so that more flexibility is provided with respect to the designing of the magnetic field probe.

Figure 4:
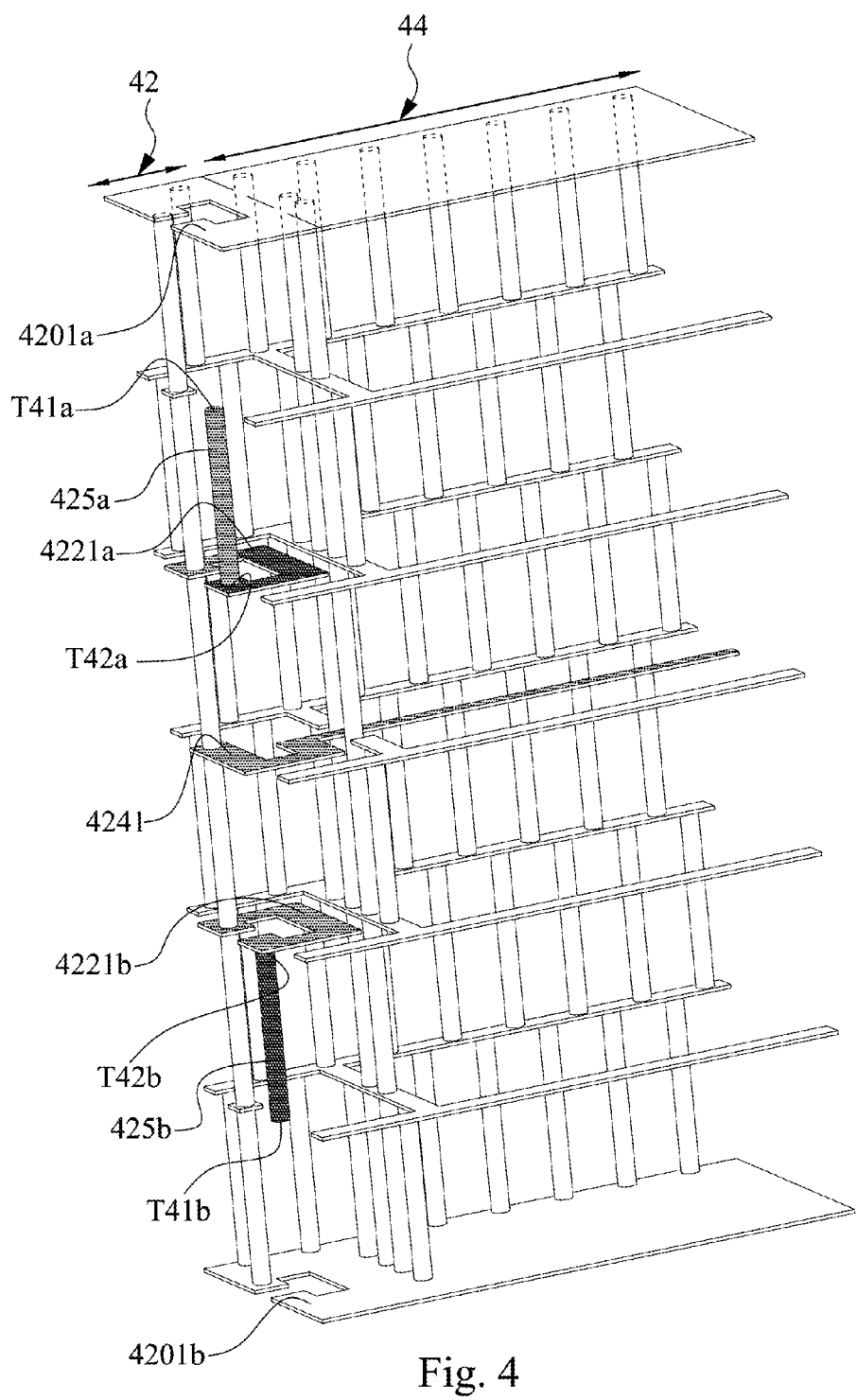
FIG. 4 depicts a perspective view of a magnetic field probe according to a third embodiment of this invention.

FIG. 4 depicts a perspective view of a magnetic field probe according to a third embodiment of this invention. When compared with FIG. 2, a probe head 42 according to the present embodiment further comprises an extending connection metal portion 425a and an extending connection metal portion 425b. The extending connection metal portion 425a and the extending connection metal portion 425b are respectively configured for extending lengths of an annular filtering metal portion 4221a and an annular filtering metal portion 4221b. The extending connection metal portion 425a and the extending connection metal portion 425b have a floating end T41a and a floating end T41b, respectively. An end T42a of the extending connection metal portion 425a is connected to the annular filtering metal portion 4221a. An end T42b of the extending connection metal portion 425b is connected to the annular filtering metal portion 4221b. It is noted that those of ordinary skill in the art may selectively dispose the extending connection metal portion 425a and the extending connection metal portion 425b as required by practical needs. For example, the connection between the extending connection metal portion 425a and the annular filtering metal portion 4221a is retained but the length of the annular filtering metal portion 4221b is not extended so that the frequency band of a magnetic field probe 40 having an effect of an electric field band rejection filter in which the electric field is filtered out may be fine tuned, and the present invention is not limited in the specific embodiment.

Figure 5:
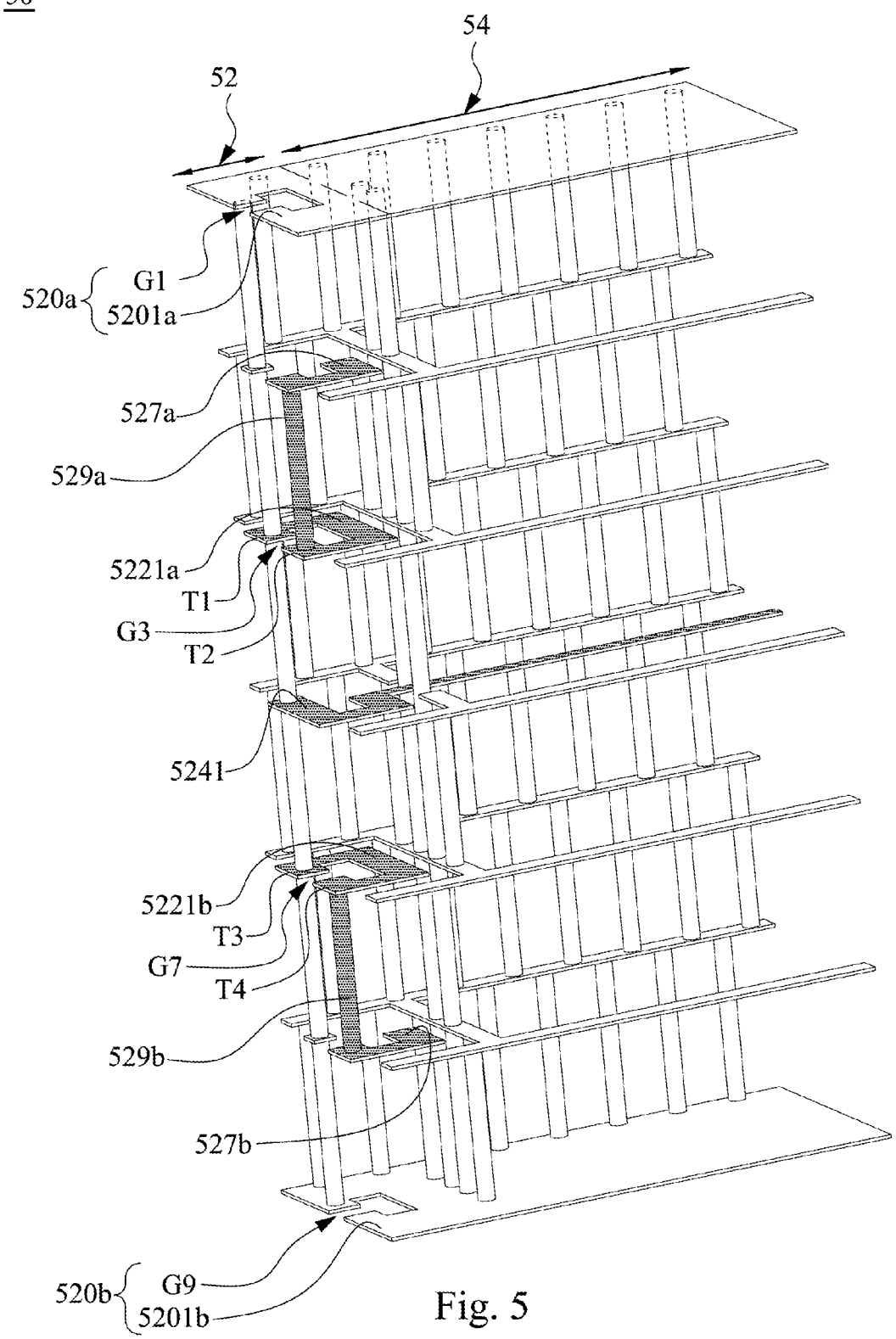
FIG. 5 depicts a perspective view of a magnetic field probe according to a fourth embodiment of this invention.

FIG. 5 depicts a perspective view of a magnetic field probe according to a fourth embodiment of this invention. When compared with FIG. 2, a probe head 52 according to the present embodiment further comprises an extending metal portion 527a and an extending metal portion 527b. The extending metal portion 527a and the extending metal portion 527b are respectively configured for extending lengths of an annular filtering metal portion 5221a and an annular filtering metal portion 5221b. Besides, the capacitances between the shielding metal portions (520) and filtering metal portions (5221a, 5221b) increase. The extending metal portion 527a is stacked between the annular filtering metal portion 5221a and a shielding metal layer 520a and is connected to the annular filtering metal portion 5221a. The extending metal portion 527b is stacked between the annular filtering metal portion 5221*b* and a shielding metal layer 520*b* and is connected to the annular filtering metal portion 5221*b*. In greater detail, in one embodiment, the probe head 52 further comprises an extending connection metal portion 529*a* and an extending connection metal portion 529*b*, so that the extending metal portion 527*a* is connected to an end T2 of the annular filtering metal portion 5221*a* via the extending connection metal portion 529*a* and the extending metal portion 527*b* is connected to an end T4 of the annular filtering metal portion 5221*b* via the extending connection metal portion 529*b*.

Through the embodiments shown in FIG. 4 and FIG. 5, the annular filtering metal portions may be extended so as to adjust the frequency band of a magnetic field probe having the effect of an electric field band rejection filter in which the electric field is filtered out. For example, the frequency at which the electric field is filtered out can be adjusted to a frequency within a lower frequency band without increasing a loop size of the receiving metal portion or a size of the probe head. Thus, the spatial resolution is not sacrificed so that the present invention magnetic field probe can be applied in the magnetic field detection requiring a higher spatial resolution and a wider band. However, a method for extending the annular filtering metal portions is not limited to the method disclosed in the above embodiments. Those of ordinary skill in the art may adjust the size of the annular filtering metal portions as required by practical needs so as to adjust the frequency band of the magnetic field probe having the effect of an electric field band rejection filter in which the electric field is filtered out.

Figure 6:
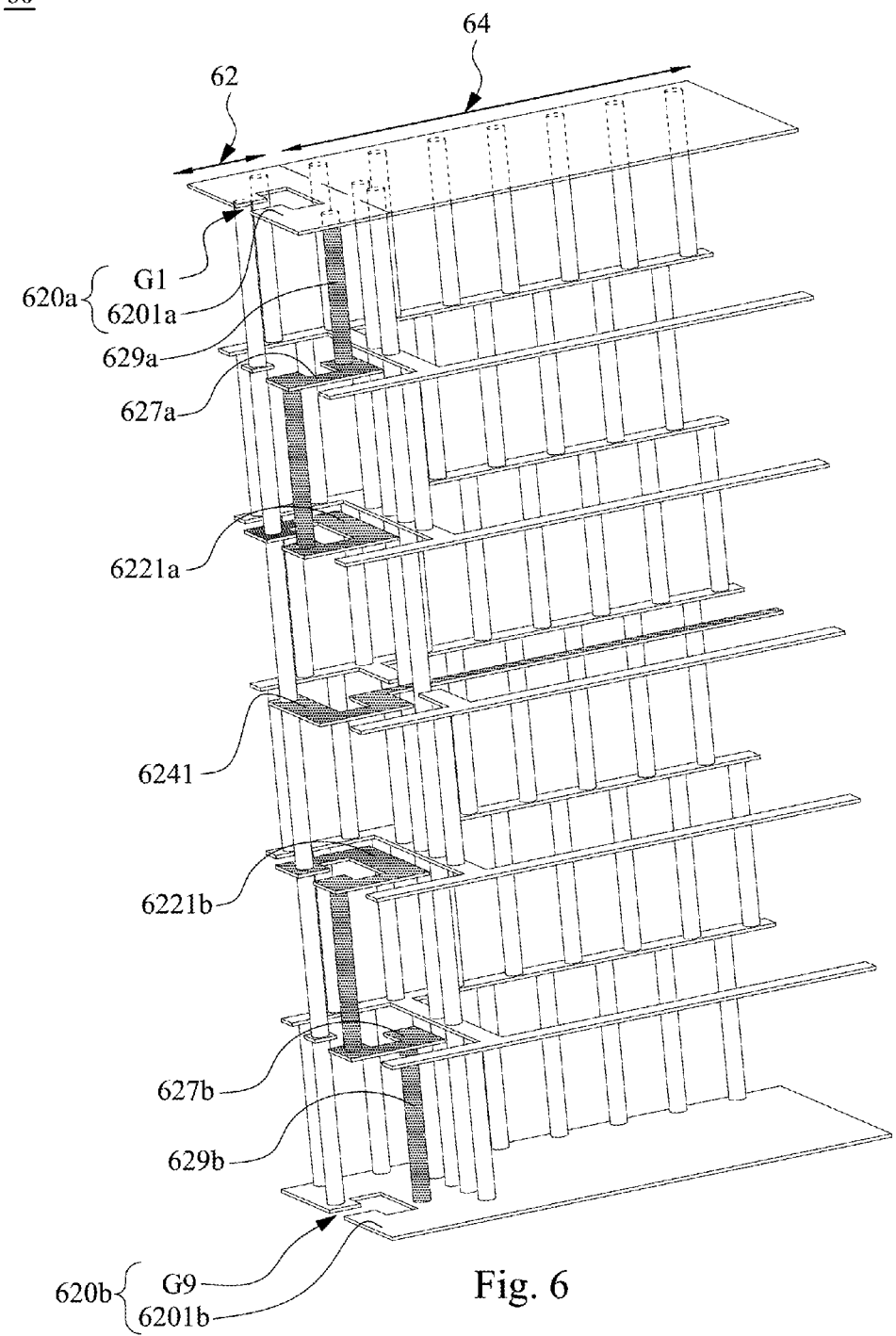
FIG. 6 depicts a perspective view of a magnetic field probe according to a fifth embodiment of this invention.

FIG. 6 depicts a perspective view of a magnetic field probe according to a fifth embodiment of this invention. When compared with FIG. 5, a probe head 62 according to the present embodiment further comprises a shorting portion 629*a* and a shorting portion 629*b*. The shorting portion 629*a* and the shorting portion 629*b* are configured for inducing inductances to the probe head 62 through the shorting portion 629*a* and the shorting portion 629*b*. Hence, the frequency of a magnetic field probe 60 having effects of a high-pass and band-rejection electric field filter at which the electric field is filtered out may be adjusted as required by practical needs. For example, the frequency of the magnetic field probe 60 at which the electric field is filtered out may be adjusted to a frequency within a higher frequency band.

The shorting portion 629*a* is connected between an extending metal portion 627*a* and a shielding metal layer 620*a*. The shorting portion 629*b* is connected between an extending metal portion 627*b* and a shielding metal layer 620*b*. In greater detail, in one embodiment, the extending metal portion 627*a* is connected to an annular shielding metal portion 6201*a* of the shielding metal layer 620*a* via the shorting portion 629*a*. The extending metal portion 627*b* is connected to an annular shielding metal portion 6201*b* of the shielding metal layer 620*b* via the shorting portion 629*b*. It is noted that a connection position of the shorting portion 629*a* and the extending metal portion 627*a* and a connection position of the shorting portion 629*b* and the extending metal portion 627*b* are not limited to the connection positions of the specific embodiment. Those of ordinary skill in the art may adjust the above-mentioned connection positions as required by practical needs.

Through the embodiment shown in FIG. 6, the frequency of the magnetic field probe 60 at which the electric field is filtered out can be adjusted to a frequency within a higher frequency band without shrinking a loop size of a receiving metal portion 6241 or a size of the probe head 62. Thus, designing of the magnetic field probe is not restricted by process so that more flexibility is provided with respect to the designing of the magnetic field probe.

Figure 7:
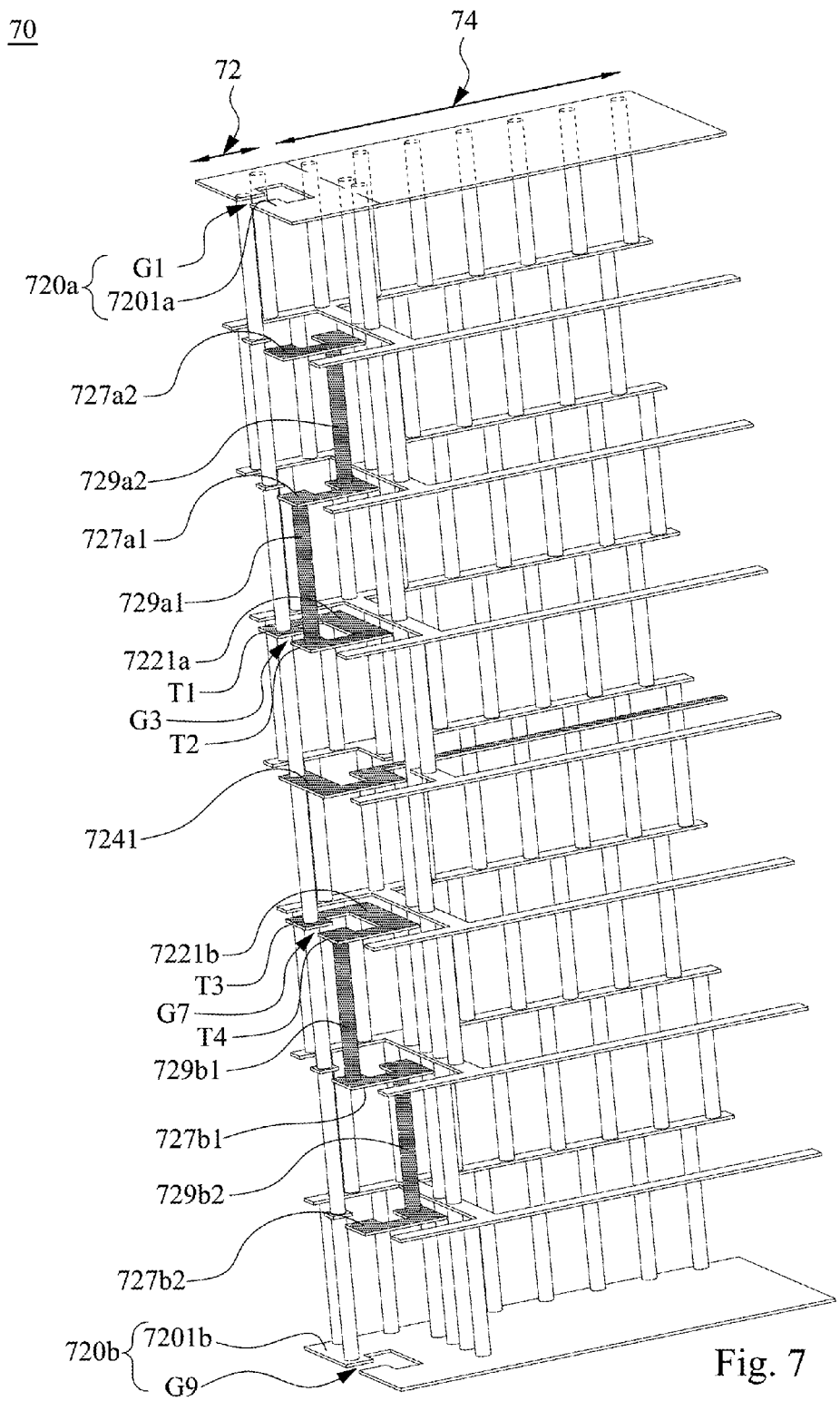
FIG. 7 depicts a perspective view of a magnetic field probe according to a sixth embodiment of this invention.

FIG. 7 depicts a perspective view of a magnetic field probe according to a sixth embodiment of this invention. When compared with FIG. 2, a probe head 72 according to the present embodiment further comprises a plurality of extending metal portions 727*a*1-727*a*2 sequentially connected between an annular filtering metal portion 7221*a* and a shielding metal layer 720*a*, and a plurality of extending metal portions 727*b*1-727*b*2 sequentially connected between an annular filtering metal portion 7221*b* and a shielding metal layer 720*b*. The above-mentioned extending metal portions 727*a*1-727*b*2 are configured for extending lengths of the annular filtering metal portion 7221*a* and the annular filtering metal portion 7221*b*. Hence, the frequency band of a magnetic field probe 70 having an effect of an electric field band rejection filter in which the electric field is filtered out may be adjusted. For example, the frequency at which the electric field is filtered out can be adjusted to a frequency within a lower frequency band.

In greater detail, in one embodiment, the probe head 72 further comprises a plurality of extending connection metal portions 729*a*1-729*a*2 and a plurality of extending connection metal portions 729*b*1-729*b*2. For example, the extending metal portion 727*a*1 is connected to the upper-layer extending metal portion 727*a*2 via the extending connection metal portion 729*a*2. The extending metal portion 727*a*1 closest to the annular filtering metal portion 7221*a* is connected to the annular filtering metal portion 7221*a* via the extending connection metal portion 729*a*1. The extending metal portion 727*b*1 is connected to the lower-layer extending metal portion 727*b*2 via the extending connection metal portion 729*b*2, and the extending metal portion 727*b*1 closest to the annular filtering metal portion 7221*b* is connected to the annular filtering metal portion 7221*b* via the extending connection metal portion 729*b*1.

Through the embodiment shown in FIG. 7, the annular filtering metal portions may be extended so as to adjust the frequency band of the magnetic field probe 70 having the effect of an electric field band rejection filter in which the electric field is filtered out. For example, the frequency at which the electric field is filtered out can be adjusted to a frequency within a lower frequency band without increasing a loop size of the receiving metal portion 7241 or a size of the probe head 72. Thus, the spatial resolution is not sacrificed so that the present invention magnetic field probe can be applied in the magnetic field detection requiring a higher spatial resolution and a wider band. However, a method for extending the annular filtering metal portions is not limited to the method disclosed in the above embodiment. Those of ordinary skill in the art may adjust the size of the annular filtering metal portions as required by practical needs so as to adjust the frequency band of the magnetic field probe having the effect of an electric field band rejection filter in which the electric field is filtered out.

Figure 8:
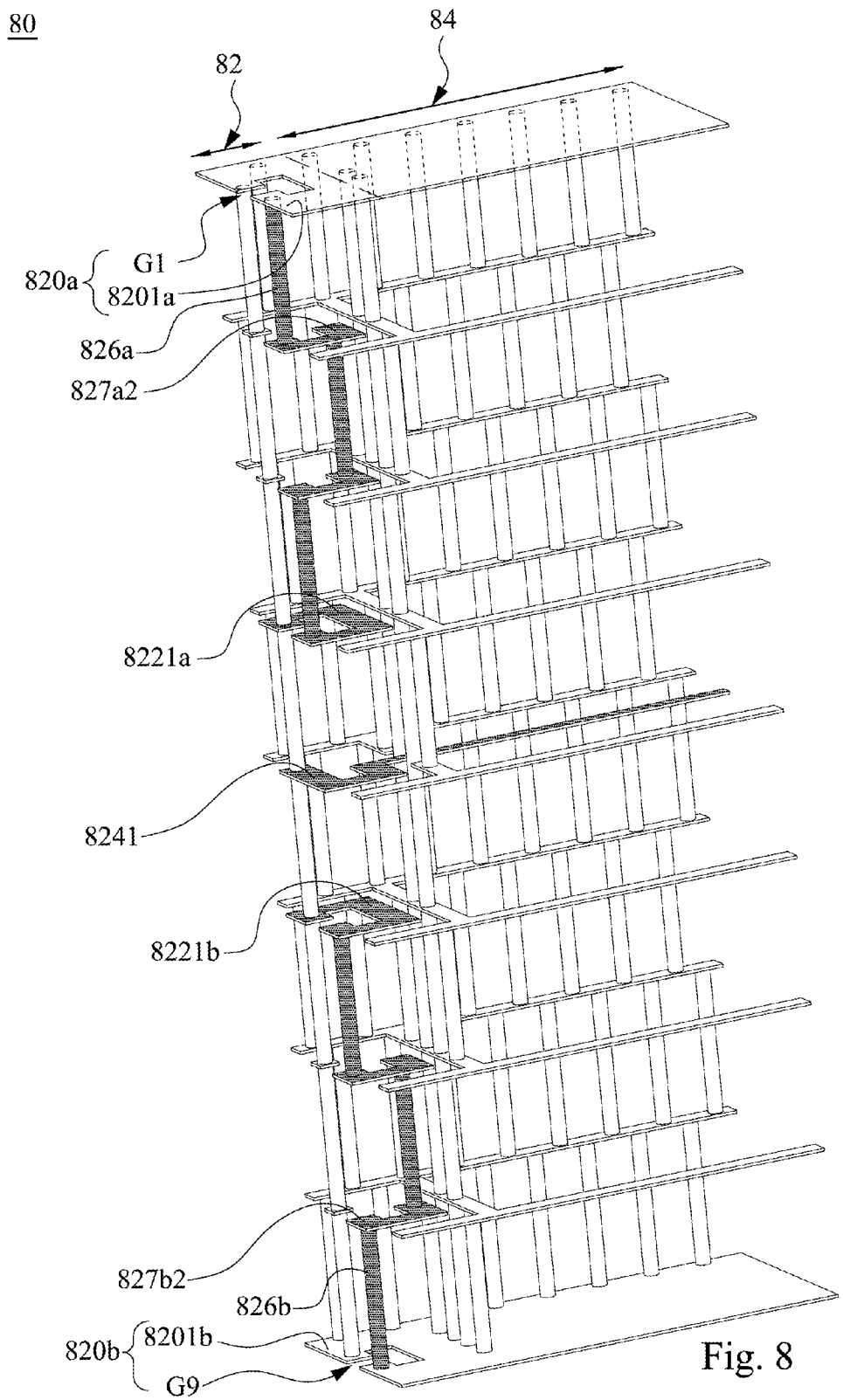
FIG. 8 depicts a perspective view of a magnetic field probe according to a seventh embodiment of this invention.

FIG. 8 depicts a perspective view of a magnetic field probe according to a seventh embodiment of this invention. When compared with FIG. 7, a probe head 82 according to the present embodiment further comprises a shorting portion 826*a* connected between one of the extending metal portions 827*a*2 and a shielding metal layer 820*a* and a shorting portion 826*b* connected between one of the extending metal portions 827*b*2 and a shielding metal layer 820*b*. The shorting portion 826*a* and the shorting portion 826*bb* are configured for inducing inductances to the probe head 82 so that the frequency of a magnetic field probe 80 having an effect of an electric field band rejection filter at which the electric field is filtered out may be adjusted as required by practical needs. For example, the frequency of the magnetic field probe 80 at which the electric field is filtered out may be adjusted to a frequency within a higher frequency band.

In greater detail, in one embodiment, the shorting portion 826a connects the extending metal portion 827a2 closest to an annular filtering metal portion 8221a to the annular shielding metal portion 8201a. The shorting portion 826b connects the extending metal portion 827b2 closest to an annular filtering metal portion 8221b to the annular shielding metal portion 8201b. It is noted that that a connection position of the shorting portion 826a and the extending metal portion 827a2 and a connection position of the shorting portion 826b and the extending metal portion 827b2 are not limited to the connection positions of the specific embodiment. Those of ordinary skill in the art may adjust the above-mentioned connection positions as required by practical needs.

According to the above-mentioned embodiments, the annular filtering metal portions are symmetrically disposed with respect to the receiving metal portion so as to effectively suppress a common mode current induced by the interfering electric field. As a result, the interfering electric field is filtered out to improve the quality of magnetic field measurement. Hence, the present invention magnetic field probe has effects of a wide-band high-pass and band-rejection electric field filter to suppress the electric field. In this manner, a smaller magnetic field probe can be designed without sacrificing the property of electric field suppression that can be applied in the magnetic field detection requiring a higher spatial resolution and a wider band.

In addition, extra inductances are induced to the probe head through the connections of the shorting portions and the extending metal portions so as to adjust the frequency of the magnetic field probe at which the electric field is filtered out to a frequency within a higher frequency band without shrinking the loop size of a receiving metal portion. Thus, designing of the magnetic field probe is not restricted by process so that more flexibility is provided with respect to the designing of the magnetic field probe.

Additionally, the annular filtering metal portions are be extended so as to adjust the frequency band of the magnetic field probe having the effect of an electric field band rejection filter in which the electric field is filtered out. For example, the frequency at which the electric field is filtered out can be adjusted to a frequency within a lower frequency band without increasing the loop size of the receiving metal portion or the size of the probe head. Thus, the spatial resolution is not sacrificed so that the present invention magnetic field probe can be applied in the magnetic field detection requiring a higher spatial resolution and a wider band.

In addition, the present invention multi-layered magnetic field probe can be fabricated by various processes (such as the low temperature co-fired ceramic process, LTCC process) conveniently, thus being easily mass-produced to lower the cost.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A magnetic field probe comprising:
   a probe head comprising:
   a first annular shielding metal portion having a gap;
   a second annular shielding metal portion stacked below the first annular shielding metal portion, the second annular shielding metal portion having another gap, and a shape of the second annular shielding metal portion corresponding to a shape of the first annular shielding metal portion;
   a receiving metal portion stacked between the first annular shielding metal portion and the second annular shielding metal portion, the receiving metal portion being configured for receiving a magnetic field to be measured to generate a sensing signal, the first annular shielding metal portion and the second annular shielding metal portion being configured for shielding the receiving metal portion;
   a first annular filtering metal portion stacked between the first annular shielding metal portion and the receiving metal portion, the first annular filtering portion being configured for filtering out an electric field interfering with the receiving metal portion, and the first annular filtering metal portion having a first gap, a first end, and a second end across the first gap; and
   a second annular filtering metal portion stacked between the second annular shielding metal portion and the receiving metal portion, the second annular filtering portion being configured for filtering out the electric field interfering with the receiving metal portion, and the second annular filtering metal portion having a second gap, a third end, and a fourth end across the second gap; and
   a probe body connected to the probe head, the probe body being configured for receiving the sensing signal from the receiving metal portion and transmitting the sensing signal to a measuring instrument.

2. The magnetic field probe of claim 1, wherein the probe head further comprises:
   at least one connecting metal portion, wherein the first end of the first annular filtering metal portion and the third end of the second annular filtering metal portion are connected to the first annular shielding metal layer and the second annular shielding metal layer via the at least one connecting metal portion.

3. The magnetic field probe of claim 2, wherein the probe head further comprises:
   a first shorting portion, wherein the second end of the first annular filtering metal portion is connected to the first annular shielding metal portion via the first shorting portion; and
   a second shorting portion, wherein the fourth end of the second annular filtering metal portion is connected to the second annular shielding metal portion via the second shorting portion.

4. The magnetic field probe of claim 1, wherein the probe head further comprises:
   a first extending metal portion stacked between the first annular filtering metal portion and the first annular shielding metal portion;
   a first extending connection metal portion, wherein the first extending metal portion is connected to the second end of the first annular filtering metal portion via the first extending connection metal portion;

a second extending metal portion stacked between the second annular filtering metal portion and the second annular shielding metal portion; and a second extending connection metal portion, wherein the second extending metal portion is connected to the fourth end of the second annular filtering metal portion via the second extending connection metal portion.

5. The magnetic field probe of claim 4, wherein the probe head further comprises:

a first shorting portion, wherein the first extending metal portion is connected to the first annular shielding metal portion via the first shorting portion; and a second shorting portion, wherein the second extending metal portion is connected to the second annular shielding metal portion via the second shorting portion.

6. The magnetic field probe of claim 1, wherein the probe head further comprises:

a plurality of first extending metal portions being sequentially stacked between the first annular filtering metal portion and the first annular shielding metal portion;

a plurality of first extending connection metal portions, wherein each of the first extending metal portions is respectively connected to the upper-layer first extending metal portion and the lower-layer first extending metal portion via one of the first extending connection metal portions and one of the other first extending connection metal portions, and the first extending metal portion which is closest to the first annular filtering metal portion among all said first extending metal portions is connected to the first annular filtering metal portion via one of the first extending connection metal portions;

a plurality of second extending metal portions being sequentially stacked between the second annular filtering metal portion and the second annular shielding metal portion; and a plurality of second extending connection metal portions, wherein each of the second extending metal portions is respectively connected to the upper-layer second extending metal portion and the lower-layer second extending metal portion via one of the second extending connection metal portions and one of the other second extending connection metal portions, and the second extending metal portion which is closest to the second annular filtering metal portion among all said second extending metal portions is connected to the second annular filtering metal portion via one of the second extending connection metal portions.

7. The magnetic field probe of claim 6, wherein the probe head further comprises:

a first shorting portion being connected between the first extending metal portion which is closest to the first annular shielding metal portion, and the first annular shielding metal portion; and a second shorting portion being connected between the second extending metal portion which is closest to the second annular shielding metal portion, and the second annular shielding metal portion.

8. The magnetic field probe of claim 1, wherein the probe body further comprises:

a first shielding metal portion being connected to the first annular shielding metal portion;

a second shielding metal portion being stacked below the first shielding metal portion, and being connected to the second annular shielding metal portion; and a transmitting metal portion configured for transmitting the sensing signal to the measuring instrument, and the transmitting metal portion being stacked between the first shielding metal portion and the second shielding metal portion.

9. The magnetic field probe of claim 8, wherein the probe body further comprises:

a plurality of shielding metal connection portions connected between the first shielding metal portion and the second shielding metal portion.

* * * * *